United States Patent [19]

Marangon et al.

[11] Patent Number: 5,786,272
[45] Date of Patent: *Jul. 28, 1998

[54] METALLIZATION OVER TUNGSTEN PLUGS

[75] Inventors: Maria Santina Marangon, Cernusco sul Naviglio; Andrea Marmiroli, Alzano Lombardo; Giorgio Desanti, Milan, all of Italy

[73] Assignee: SGS-Thomson Microelectronics S.r.l., Agrate Brianza, Italy

[*] Notice: The term of this patent shall not extend beyond the expiration date of Pat. No. 5,407,861.

[21] Appl. No.: 423,397

[22] Filed: Apr. 18, 1995

Related U.S. Application Data

[63] Continuation of Ser. No. 68,139, May 26, 1993, Pat. No. 5,407,861.

[30] Foreign Application Priority Data

May 27, 1992 [EP] European Pat. Off. ............ 92830265

[51] Int. Cl.⁶ .................................................. H01L 21/44
[52] U.S. Cl. ..................... 438/628; 438/714; 438/644; 438/656; 438/672
[58] Field of Search ........................... 437/192, 203, 437/245, 246; 156/643.1, 652.1, 656.1; 438/628, 634, 644, 672, 963, 970, 974, 714, 720, 648, 685, 656

[56] References Cited

U.S. PATENT DOCUMENTS

| | | |
|---|---|---|
| 4,980,018 | 12/1990 | Mu et al. |
| 5,164,330 | 11/1992 | Davis et al. |
| 5,227,337 | 7/1993 | Kadomura |
| 5,407,861 | 4/1995 | Marangon et al. |
| 5,514,622 | 5/1996 | Bornstein et al. ............ 437/189 |
| 5,521,119 | 5/1996 | Chen et al. ............ 437/187 |

FOREIGN PATENT DOCUMENTS

| | | |
|---|---|---|
| 0343698 | 4/1989 | European Pat. Off. |
| 0596364 | 5/1994 | European Pat. Off. |
| 6-112172 | 4/1994 | Japan |

OTHER PUBLICATIONS

P. Riley et al., "Implementation of Tungsten Metallization in Multilevel Interconnection Technologies" IEEE Transactions on Semiconductor Manufacturing, vol. 3, No. 4, Nov. 1990, pp. 150–157.

J. Theisen et al., "Maskless Tungsten Etch Process for Plug Fill" Extended Abstracts, vol. 90–1, No. 165, 1990, Princeton, NJ, pp. 248–249.

Patent Abstracts of Japan, vol. 16, No. 300 (E-1227), Jul. 2, 1992.

K. Koller et al "Tungsten Plug Formation by an Optimized Tungsten Etch Back Process in Non–Fully Planarized Topology" Applied Surface Science (Month Unknown 1991) pp. 54–61.

*Primary Examiner*—Caridad Everhart
*Attorney, Agent, or Firm*—David V. Carlson; Bryan A. Santarelli; Seed and Berry LLP

[57] ABSTRACT

A plug contact process wherein, after contact holes are etched, an adhesion layer (such as Ti/TiN) and a filler metal (such as tungsten) are deposited overall. A two-stage etch is then used: First, the filler metal is etched preferentially with respect to the adhesion layer, until an endpoint signal first indicates that said adhesion layer is exposed. No overetch is used at this stage. Thereafter a nonpreferential etch is used to clear residues of the filler metal, while also uniformly reducing the height of the adhesion layer. This prevents the tops of the plugs in the contact holes from being recessed. Aluminum (or other metal) is then deposited and patterned (using a stack etch to remove the undesired portions of the adhesion layer too) to implement the desired wiring pattern. This process thereby reduces voids, and resulting metallization defects, in a process with high-aspect-ratio contacts. In addition, the residual adhesion layer helps to reduce electromigration.

51 Claims, 1 Drawing Sheet

METALLIZATION OVER TUNGSTEN PLUGS

This is a continuation application of Ser. No. 08/068,139, filed May 26, 1993, now issued as U.S. Pat. No. 5,407,861.

CROSS-REFERENCE TO RELATED APPLICATION

This application claims priority from European App'n Ser. No. 92830265.2, filed May 27, 1992, which is hereby incorporated by reference.

BACKGROUND AND SUMMARY OF THE INVENTION

The present invention relates generally to the fabrication of integrated circuits, and particularly to integrated circuits with an extremely high degree of compactness (e.g. ULSI devices) such as memories, logic arrays and the like.

The formation of submicron-size contacts (to a semiconducting substrate and/or to conducting layers formed above the semiconducting substrate) represents a very critical aspect of a manufacturing process. Various technological problems must be solved to ensure continuity and uniformity of thickness of the resulting wiring.

Sputter deposition of aluminum alloys (such as aluminum-silicon or aluminum-copper) has been widely utilized in the past for filling contact holes and forming metallization layers. However, these techniques have proved inadequate for filling cavities having a submicron width, such as contact openings (holes) prearranged through an isolation dielectric layer, commonly of silicon oxide or a silicate glass.

Chemical vapor deposition ("CVD") is a technique of isotropically depositing metallic materials from a gas flow. This deposition technique ensures a very effective filling (step-coverage) of submicron cavities, and has rapidly found widespread application. The metal most commonly used for this purpose is tungsten.

Based on these developments, one contact fabrication technique comprises the following steps:

A) A barrier and adhesion layer (or multilayer) of titanium and/or titanium nitride is deposited, with a total thickness which is commonly between 50 and 200 nm. This deposition coats the surface of the semiconductor at the bottom of the openings formed through a layer of dielectric material, as well as the walls of the contact hole through the dielectric layer and the surface of the dielectric layer. At the bottom of the contact hole, the titanium and/or titanium nitride layer prevents an excessive diffusion of the subsequently deposited filler metal into the semiconducting substrate, and at the same time favors the establishment of a good electrical continuity (low contact resistance) through the formation of an alloy with the silicon substrate at the metal semiconductor interface.

B) Subsequently, a layer of tungsten is deposited by CVD to fill completely the contact holes.

C) A blanket (global) etch with a high selectivity toward the underlying titanium nitride adhesion layer eliminates the tungsten from the surface of the dielectric layer while leaving plugs of tungsten within the contact holes.

D) Standard plasma monitoring techniques will readily indicate when the tungsten has been etched sufficiently to expose the titanium nitride adhesion layer. Thereafter, a continued selective overetch of the tungsten must necessarily be carried out, in order to eliminate tungsten residues from the surface. (Such residues are likely to be found where the surface is nonplanar, e.g. along the line of a "step" caused by the topography of underlying layers.)

The problem is that, because of the erosion of the tungsten which is exposed to the overetch phase, the height of the tungsten plugs in the contacts may be undesirably reduced. If the height of plugs is excessively recessed in respect to the plane of the surface which covered by the adhesion layer of titanium nitride, cavities may occur during a subsequent sputter deposition of a metallization layer. For example, aluminum-silicon alloy, which is customarily deposited by sputtering, is susceptible to notching as illustrated in FIG. 1.

One modified approach might be to etch away the adhesion layer of titanium nitride from the surface of the dielectric, in order to reduce the degree of recession of the tungsten plugs in respect to the plane of the surface, before depositing a metallization layer of an aluminum-silicon alloy. Although this would reduce the tendency of the metallization layer to form occluded or not occluded (hidden or open) voids over recessed tungsten plugs, this approach would also cause a weakening in terms of long term reliability of the devices, especially because of electromigration phenomena of the Al/Si alloy.

Innovative Modified Process with Two-Stage Etch

It has now been found that by stopping the blanket etch of the deposited tungsten upon the exposure of the underlying layer of titanium nitride, without continuing into a substantial overetch phase, any backing off of the top of the tungsten plugs of the contacts is prevented. At this point, by modifying the selectivity condition of the blanket plasma etch in order to reduce the selectivity sufficiently to produce also a substantial etching of the titanium nitride together with the tungsten, a second etching step is performed during which the residues of tungsten on the surface are effectively eliminated and at the same time with a "lowering" of the tops of the tungsten plugs in the contacts, a similar "lowering" of the top surface of the titanium nitride adhesion layer is obtained, this material too being subject to etch. In this manner the front of the device is etched in a substantially uniform way without producing a recession of the tungsten plugs in respect to the rest of the surface. This second etching step, conducted under reduced selectivity conditions toward titanium nitride, is continued until ensuring an effective removal of any residue of tungsten from the surface but essentially before completely eliminating the adhesion layer of titanium nitride from the same surface. In this way, by means of only two etching steps, three advantageous results are achieved: a) removal of residues of tungsten from the surface; b) conservation of a residual titanium nitride adhesion layer on the surface; and c) prevention of any substantial recession of the tungsten plugs in the contacts.

The residual layer of titanium nitride between a metallization layer of an aluminum alloy and the underlying dielectric layer (commonly an oxide), will inhibit or reduce the rate of electromigration phenomena. (Electromigration is a well-known problem in thin film metallization: the aluminum alloy will gradually flow, at a current-density-dependent rate, in a direction opposite to the conventional direction of the electric current causing interruptions of electrical continuity in metal lines.)

According to one class of teachings of the present invention, there is provided: a plug contact process wherein, after contact holes are etched, an adhesion layer (such as Ti/TiN) and a filler metal (such as tungsten) are deposited overall. A two-stage etch is then used: First, the filler metal is etched preferentially with respect to the adhesion layer, until an endpoint signal first indicates that the adhesion layer is exposed. No overetch is used at this stage. Thereafter a nonpreferential etch is used to clear residues of the filler metal, while also uniformly reducing the height of the adhesion layer. This prevents the tops of the plugs in the contact holes from being recessed. Aluminum (or other metal) is then deposited and patterned (using a stack etch to remove the undesired portions of the adhesion layer too) to implement the desired wiring pattern. This process thereby reduces voids, and resulting metallization defects, in a process with high-aspect-ratio contacts. In addition, the residual adhesion layer helps to reduce electromigration.

According to one class of teachings of the present invention, there is provided: an integrated circuit fabrication method, comprising the steps of: providing a substrate which includes one or more semiconductor devices, with an insulating layer thereover; etching contact holes in predetermined locations of the insulating layer; depositing an adhesion layer on the insulating layer and into the contact holes; depositing a filler metal overall; applying RF power to a controlled gas mixture to perform a first unpatterned etch, which etches the filler metal preferentially with respect to the adhesion layer, until the adhesion layer is exposed but the filler metal has not yet been removed outside the contact holes; applying RF power to a controlled gas mixture to perform a second unpatterned etch, which etches the filler metal equally with the adhesion layer, until the filler metal has been totally removed outside the contact holes; depositing a metallization layer overall; and patterning the metallization layer and the adhesion layer to implement a predetermined wiring pattern which includes connection to the filler metal in multiple ones of the contact holes.

According to one class of teachings of the present invention, there is provided: an integrated circuit fabrication method, comprising the steps of: providing a substrate which includes one or more semiconductor devices, with an insulating layer thereover; etching contact holes in predetermined locations of the insulating layer; depositing an adhesion layer on the insulating layer and into the contact holes; depositing a filler metal overall; applying RF power to a controlled gas mixture to perform a first etch, which etches the filler metal preferentially with respect to the adhesion layer, and stopping the first etch when erosion of the adhesion layer is detected; applying RF power to a controlled gas mixture to perform a timed second etch, which etches the filler metal equally with the adhesion layer, until the filler metal has been totally removed outside the contact holes; depositing a metallization layer overall; and patterning the metallization layer to implement a predetermined wiring pattern which includes connection to the filler metal in multiple ones of the contact holes.

According to one class of teachings of the present invention, there is provided: an integrated circuit fabrication method, comprising the steps of: providing a substrate which includes an insulating layer, including at least 25% at of silicon and at least 40% at of oxygen, at a surface thereof; etching contact holes in predetermined locations of the insulating layer, at least some ones of the contact holes having a greater depth than width; depositing an adhesion layer comprising titanium on the insulating layer and into the contact holes; conformally depositing a filler metal overall; applying RF power to a controlled gas mixture to perform a first etch, which etches the filler metal preferentially with respect to the adhesion layer, and stopping the first etch when erosion of the adhesion layer is detected; applying RF power to a controlled gas mixture to perform a timed second etch, which etches the filler metal equally with the adhesion layer, until the filler metal has been totally removed outside the contact holes; depositing a metallization layer overall; and patterning the metallization layer to implement a predetermined wiring pattern which includes connection to the filler metal in multiple ones of the contact holes.

According to one class of teachings of the present invention, there is provided: a process for forming a metallization film over tungsten plugs, formed by defining and etching openings through a dielectric layer, depositing an adhesion layer of titanium nitride, depositing a tungsten layer on the adhesion layer and etching the tungsten until exposing the adhesion layer of titanium nitride over the surface of the dielectric layer under etch selectivity conditions of tungsten versus titanium nitride, thus leaving the plugs of tungsten into the openings and tungsten residues along discontinuities from planarity of the surface, stopping the first etching step upon exposing the adhesion layer of titanium nitride; modifying the etch selectivity conditions by reducing etch selectivity sufficiently to produce also an etching of titanium nitride together with tungsten; performing a second etching step under these modified selectivity conditions for the residues of tungsten from the surface while simultaneously etching the tungsten plugs and the adhesion layer of titanium nitride, partially reducing the thickness of the latter; depositing a metallization layer over a residual layer of titanium nitride and over the tungsten plugs; patterning a stack composed of the metallization layer and the residual layer of titanium nitride.

The etch selectivity of tungsten toward titanium nitride essentially derives from the use of a fluorine based plasma (e.g. an $SF_6$ plasma), since $WF_6$ is volatile and $TiF_4$ is not. In various embodiments of the invention, the selectivity may be between about 30:1 and about 15:1, during the first tungsten etch may be reduced to between 15:1 and about 1:10 by adding chlorine to $SF_6$ in a quantity sufficient to reduce the etch selectivity of tungsten versus titanium nitride to said range for carrying out a second etching step. Thus, it should be noted that it is not strictly necessary for the second etch to be nonselective.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
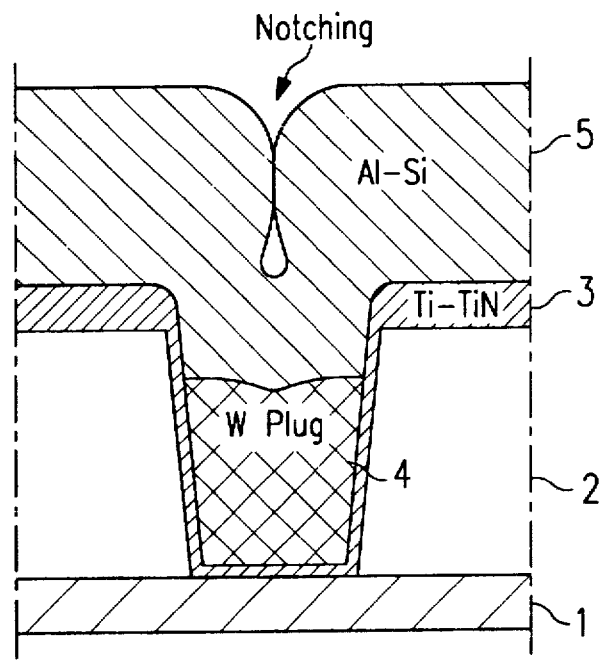
FIG. 1 schematically depicts the notching of an Al—Si metallization layer above a recessed tungsten plug.
Figure 2:
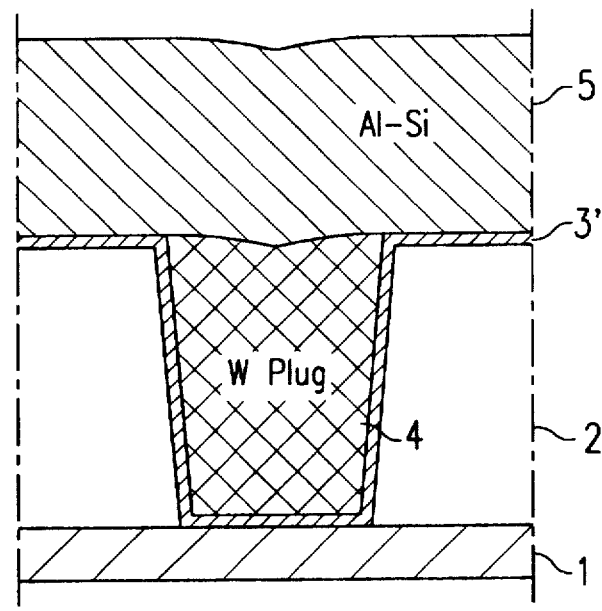
FIG. 2 is a partial microsection showing the result that is obtained with the improved process of the invention.

With reference to FIG. 1, a contact with a semiconducting substrate 1, covered with a dielectric layer 2, is formed by making a hole, through dielectric 2, to expose the surface to be contacted (e.g. a source/drain diffusion in the semiconducting substrate 1) and depositing a barrier/adhesion layer of titanium and/or titanium nitride 3 or only of titanium nitride, depositing a filler layer of tungsten by chemical vapor deposition (CVD), and subsequently etching the deposited tungsten layer until the surface of the adhesion layer 3 is exposed. In conventional methods, the required further overetch step of tungsten in order to remove residues of this metal from the surface, along discontinuities of the surface from perfect planarity (e.g. steps, trenches, etc.), produces a recession of the top of the tungsten plug 4 in the contact. The occurrence of excessively recessed tungsten plugs 4 may cause, as depicted in FIG. 1, a notching phenomena of the metallization layer, e.g. an aluminum-silicon alloy deposited by sputtering, which may determine the formation of an occluded or (non-occluded) cavity above a recessed contact. The thinning of the conducting cross section of the metallization layer in these hollow zones may cause a localized overheating which may lead to an interruption of electrical continuity.

By contrast, in accordance with the improved process of the invention, by interrupting the tungsten etch upon exposing the adhesion layer 3 of titanium nitride and by modifying the etch selectivity conditions before performing a second etching step of the tungsten residues on the surface, and inevitably also of the top of the tungsten plugs 4 as well as of the adhesion layer 3 of titanium nitride, produces, beside the desired complete removal of any tungsten residues from the surface, a lowering, substantially in a coplanar manner, of the etch front both on the titanium nitride present on the surface, as well as on the tungsten plugs 4. This second etching step is interrupted before exposing the underlying surface of the dielectric layer 2, thus leaving a residual layer 3', though thinned out, of titanium nitride on the surface of the dielectric layer 2. The stack composed of the titanium nitride residual layer 3' and the metallization layer 4 may then be patterned as needed for defining the required metal lines. (This etching step will also remove any undesired portions of the adhesion layer.) This ensures a better resistance to electromigration of a metallization film of aluminum-silicon alloy. It has been found, in fact, that on overheating, the tendency of the aluminum alloy to electromigrate over a dielectric oxide substrate (e.g. the isolation layer 2), is strongly inhibited by the presence of a residual layer of titanium nitride 3' at the interface between the aluminum metal and an oxide layer 2.

A sample process recipe for implementation of this invention is as follows. However, of course, it will readily be appreciated by those of ordinary skill in the art that all of the specific parameters can be varied, and may need to be adjusted to the specific conditions of different plasma reactors.

| Wafer size: | 150 mm |
| thickness of dielectric 2: | 1.20 μm; |
| width of contact hole: | 0.7 μm; |
| Formation of Adhesion layer 3: | |
| Sputter Deposition of Ti to | 50 nm thickness; |
| Sputter Deposition of TiN to | 100 nm thickness; |
| CVD W deposition to about | 800 nm thickness. |
| First Etch step: | |
| Total pressure: | 180 mTorr |
| Flow of SF$_6$: | 70 sccm |
| Flow of Ar: | 40 sccm |
| RF power: | 220 Watts |
| typical duration to clear: | 150 sec. |
| Second Etch step: | |
| Total pressure: | 180 mTorr |

-continued

| Flow of SF$_6$: | 40 sccm |
| Flow of Cl$_2$: | 40 sccm |
| Flow of Ar: | 20 sccm |
| RF power: | 200 Watts |
| duration: | 60 sec. |
| Measured final thickness of TiN over oxide: | 30–150 nm. |

The measured final thickness of TiN over oxide will be affected by the tungsten residue removal conditions, but all of the achieved range of 30–150 nm thickness is acceptable.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

The disclosed invention is particularly advantageous for processes where contact holes with a high aspect ratio are needed. However, it is not strictly limited to such processes.

Similarly, while the disclosed invention is particularly advantageous for use with contact holes having vertical sidewalls, it is not strictly limited to such processes.

Similarly, while the disclosed invention is particularly advantageous for designs—such as gate arrays and microprocessors—where contact spacing and metal pitch are especially important, it is not by any means limited to those particular types of devices.

Of course, as will readily be recognized by those of ordinary skill in the art of integrated circuit processing, the specific process recipes given can be varied, while still achieving the innovative functional relationships described and claimed. For example, powers can be adjusted for 200 mm wafers; SF$_6$ can be combined with or replaced by other fluorine source gasses; Cl$_2$ can be combined with or replaced by other chlorine source gasses; wafer temperature control can be used if desired; and powers and pressures can be adjusted to optimize etch rate, selectivity, substrate heating for a particular reactor.

The overlying metal layer is Al:Si, in the presently preferred embodiment, but of course other metals or metal alloys can be used instead.

The surface of the dielectric layer through which the contact hole is etched may include plasma-deposited oxide, a silicate glass, CVD oxide, or a multilayer structure including multiple ones of these. Alternatively and less preferably, other dielectric materials may also be substituted.

Alternatively and less preferably, other metals than tungsten can be used for the filler metal, as long as the foregoing etch relations are preserved.

Alternatively and less preferably, other materials besides the Ti/TiN system can be used for the adhesion layer, as long as the foregoing etch relations are preserved.

Note that the disclosed innovations are not applicable only to contacts to silicon, but can also be applied to the fabrication of vias.

As noted above, it is not strictly necessary for the second etch to be totally nonselective. However, it is necessary that the first etch must have a far greater selectivity to the adhesion layer than does the second etch.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit fabrication method, comprising the steps of:
   (a.) providing a substrate which includes one or more semiconductor devices, with an insulating layer thereover;
   (b.) etching contact holes in desired locations of said insulating layer;
   (c.) depositing an adhesion layer on said insulating layer and into said contact holes;
   (d.) depositing a filler metal overall;
   (e.) applying RF power to a controlled gas mixture to perform a first unpatterned etch, wherein the ratio of the etch rate of the filler to the etch rate of the adhesion layer is greater than one, and etching until said adhesion layer is exposed but said filler metal has not yet been removed outside said contact holes;
   (f.) applying RF power to a controlled gas mixture to perform a second unpatterned etch, wherein said ratio is reduced and etching until said filler metal has been totally removed outside said contact holes but said adhesion layer remains in at least some locations;
   (g.) depositing a metallization layer overall; and
   (h.) patterning said metallization layer and said adhesion layer to implement a desired wiring pattern which includes connection to said filler metal in multiple ones of said contact holes.

2. The method of claim 1, wherein at least some ones of said contact holes make contact to said substrate.

3. The method of claim 1, wherein said substrate consists essentially of silicon, and at least some ones of said contact holes make contact to said substrate.

4. The method of claim 1, wherein said filler metal consists of tungsten.

5. The method of claim 1, wherein said filler metal is deposited by chemical vapor deposition.

6. The method of claim 1, wherein said insulating layer includes at least 25% at of silicon and at least 40% at of oxygen.

7. The method of claim 1, wherein said step (b) etches at least some of said contact holes to have a greater depth than width.

8. The method of claim 1, wherein said insulating layer consists essentially of silicon oxide.

9. The method of claim 1, wherein said insulating layer comprises a silicate glass.

10. The method of claim 1, wherein said metallization comprises aluminum.

11. The method of claim 1, wherein said adhesion layer is selected from the group consisting of titanium, titanium nitride, and composites of titanium with titanium nitride.

12. An integrated circuit fabrication method, comprising the steps of:
   (a.) providing a substrate which includes one or more semiconductor devices, with an insulating layer thereover;
   (b.) etching contact holes in desired locations of said insulating layer;
   (c.) depositing an adhesion layer on said insulating layer and into said contact holes;
   (d.) depositing a filler metal overall;
   (e.) applying RF power to a controlled gas mixture to perform a first etch, wherein the ratio of the etch rate of the filler to the etch rate of the adhesion layer is greater than one, and stopping said first etch when erosion of said adhesion layer is detected;
   (f.) applying RF power to a controlled gas mixture to perform a timed second etch, wherein said ratio is reduced, until said filler metal has been totally removed outside said contact holes, but said adhesion layer remains in at least some locations;
   (g.) depositing a metallization layer overall; and
   (h.) patterning said metallization layer and said adhesion layer to implement a desired wiring pattern which includes connection to said filler metal in multiple ones of said contact holes.

13. The method of claim 12, wherein at least some ones of said contact holes make contact to said substrate.

14. The method of claim 12, wherein said substrate consists essentially of silicon, and at least some ones of said contact holes make contact to said substrate.

15. The method of claim 12, wherein said filler metal consists of tungsten.

16. The method of claim 12, wherein said filler metal is deposited by chemical vapor deposition.

17. The method of claim 12, wherein said insulating layer includes at least 25% at of silicon and at least 40% at of oxygen.

18. The method of claim 12, wherein said step (b) etches at least some of said contact holes to have a greater depth than width.

19. The method of claim 12, wherein said insulating layer consists essentially of silicon oxide.

20. The method of claim 12, wherein said insulating layer comprises a silicate glass.

21. The method of claim 12, wherein said metallization comprises aluminum.

22. The method of claim 12, wherein said adhesion layer is selected from the group consisting of titanium, titanium nitride, and composites of titanium with titanium nitride.

23. An integrated circuit fabrication method, comprising the steps of:
   (a.) providing a substrate which includes an insulating layer, including at least 25% at of silicon and at least 40% at of oxygen, at a surface thereof;
   (b.) etching contact holes in desired locations of said insulating layer, at least some ones of said contact holes having a greater depth than width;
   (c.) depositing an adhesion layer comprising titanium on said insulating layer and into said contact holes;
   (d.) conformally depositing a filler metal overall;
   (e.) applying RF power to a controlled gas mixture to perform a first etch, wherein the ratio of the etch rate of the filler to the etch rate of the adhesion layer is greater than one, and stopping said first etch when erosion of said adhesion layer is detected;
   (f.) applying RF power to a controlled gas mixture to perform a timed second etch, wherein said ratio is reduced, until said filler metal has been totally removed outside said contact holes, but said adhesion layer remains in at least some locations;
   (g.) depositing a metallization layer overall; and
   (h.) patterning said metallization layer and said adhesion layer to implement a desired wiring pattern which includes connection to said filler metal in multiple ones of said contact holes.

24. The method of claim 23, wherein at least some ones of said contact holes make contact to said substrate.

25. The method of claim 23, wherein said substrate consists essentially of silicon, and at least some ones of said contact holes make contact to said substrate.

26. The method of claim 23, wherein said filler metal consists of tungsten.

27. The method of claim 23, wherein said filler metal is deposited by chemical vapor deposition.

28. The method of claim 23, wherein said insulating layer consists essentially of silicon oxide.

29. The method of claim 23, wherein said insulating layer comprises a silicate glass.

30. The method of claim 23, wherein said metallization comprises aluminum.

31. The method of claim 23, wherein said adhesion layer is selected from the group consisting of titanium, titanium nitride, and composites of titanium with titanium nitride.

32. A process for forming a metallization film over tungsten plugs, formed by defining and etching openings through a dielectric layer, depositing an adhesion layer of titanium nitride, depositing a tungsten layer on the adhesion layer and etching the tungsten until exposing the adhesion layer of titanium nitride over the surface of said dielectric layer under etch selectivity conditions of tungsten versus titanium nitride, thus leaving said plugs of tungsten into said openings and tungsten residues along discontinuities from planarity of said surface, comprising the additional steps of stopping said first etching step upon exposing said adhesion layer of titanium nitride;

modifying said etch selectivity conditions by reducing etch selectivity sufficiently to produce also an etching of titanium nitride together with tungsten;

performing a second etching step under these modified selectivity conditions for said residues of tungsten from said surface while simultaneously etching said tungsten plugs and said adhesion layer of titanium nitride, partially reducing the thickness of the latter;

depositing a metallization layer over a residual layer of titanium nitride and over said tungsten plugs; and patterning a stack composed of said metallization layer and said residual layer of titanium nitride.

33. A process as defined in claim 32, wherein said etch selectivity of tungsten versus titanium nitride during said first etching step is comprised between 30:1 and 15:1 and etch selectivity during said second etching step are reduced to within 15:1 and 1:10.

34. A process as defined in claim 33, wherein said first highly selective etching step is performed in a $SF_6$ plasma and said second etching step having a reduced selectivity is performed in a plasma of $SF_6$ and $Cl_2$.

35. An integrated circuit fabrication method, comprising the steps of:

(a.) providing a substrate which includes one or more semiconductor devices, with an insulating layer thereof which includes at least 25% at of silicon and at least 40% at of oxygen;

(b.) etching contact holes in desired locations of said insulating layer;

(c.) depositing an adhesion layer on said insulating layer and into said contact holes, said adhesion layer consisting of a material selected from the group consisting of titanium, titanium nitride, and composites of titanium with titanium nitride;

(d.) conformally depositing a filler metal comprising tungsten overall;

(e.) performing a first unpatterned etch, wherein the ratio of the etch rate of the filler metal to the etch rate of the adhesion layer is greater than one, until said adhesion layer is exposed but said filler metal has not yet been removed outside said contact holes;

(f) performing a second unpatterned etch, wherein said ratio is reduced, until said filler metal has been totally removed outside said contact holes, but said adhesion layer remains in at least some locations;

(g.) depositing a metallization layer overall; and (h.) patterning said metallization layer and said adhesion layer to implement a desired wiring pattern which includes connection to said filler metal in multiple ones of said contact holes.

36. The method of claim 35, wherein at least some ones of said contact holes make contact to said substrate.

37. The method of claim 35, wherein said substrate consists essentially of silicon, and at least some ones of said contact holes make contact to said substrate.

38. The method of claim 35, wherein said filler metal consists of tungsten.

39. The method of claim 35, wherein said filler metal is deposited by chemical vapor deposition.

40. The method of claim 35, wherein said step (b) etches at least some of said contact holes to have a greater depth than width.

41. The method of claim 35, wherein said insulating layer consists essentially of silicon oxide.

42. The method of claim 35, said insulating layer comprises a silicate glass.

43. The method of claim 35, wherein said metallization comprises aluminum.

44. The method of claim 35, wherein said second etch is a timed etch.

45. A method, comprising:

forming an opening in a dielectric layer that is disposed on a first conductive material, said opening exposing a portion of said conductive material;

forming an adhesion layer on said dielectric layer and in said opening;

filling said opening with a second conductive material;

removing a residue of said second conductive material from said adhesion layer with a first etchant until said adhesion layer is exposed, said first etchant having a first selectivity ratio that equals the quotient of a first rate at which said etchant etches said second material divided by a second rate at which said etchant etches said adhesion layer;

removing said residue with a second etchant after said adhesion layer is exposed, said second etchant having a second selectivity ratio that is less than said first ratio;

forming a conductive layer on said adhesion layer and in said opening after said removing said residue with a second etchant; and forming from said conductive and adhesion layers a conductive path that contacts said second conductive material within said opening.

46. The method of claim 45 wherein said first conductive material composes a semiconductor substrate.

47. The method of claim 45 wherein said forming an adhesion layer comprises sputter depositing titanium.

48. The method of claim 45 wherein said forming an adhesion layer comprises sputter depositing titanium nitride.

49. The method of claim 45 wherein said forming an adhesion layer comprises:

sputter depositing a layer of titanium; and sputter depositing a layer of titanium nitride on said layer of titanium.

50. The method of claim 45 wherein said conductive layer comprises aluminum.

51. The method of claim 45 wherein said filling comprises chemically vapor depositing tungsten.

* * * * *